United States Patent
Okahata et al.

(10) Patent No.: US 9,090,501 B2
(45) Date of Patent: *Jul. 28, 2015

(54) METHOD FOR REDUCING WARPAGE OF GLASS SUBSTRATE CAUSED BY CHEMICAL STRENGTHENING PROCESS, AND METHOD FOR PRODUCING CHEMICALLY STRENGTHENED GLASS SUBSTRATE

(71) Applicant: ASAHI GLASS COMPANY, LIMITED, Chiyoda-ku (JP)

(72) Inventors: Naoki Okahata, Tokyo (JP); Koji Nakagawa, Tokyo (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/313,315

(22) Filed: Jun. 24, 2014

(65) Prior Publication Data

US 2014/0305165 A1 Oct. 16, 2014

Related U.S. Application Data

(63) Continuation of application No. PCT/JP2012/082297, filed on Dec. 13, 2012.

(30) Foreign Application Priority Data

Dec. 26, 2011 (JP) .................................. 2011-283756

(51) Int. Cl.
*C03C 17/23* (2006.01)
*C03C 21/00* (2006.01)
(Continued)

(52) U.S. Cl.
CPC ................ *C03C 17/245* (2013.01); *C03C 21/00* (2013.01); *C03C 21/002* (2013.01); *C03C 2217/213* (2013.01); *C03C 2218/1525* (2013.01)

(58) Field of Classification Search
USPC .......... 428/410, 688, 689, 701, 702, 426, 432, 428/428; 427/585, 255.28, 255.29, 166, 427/255.11, 255.19, 331, 337; 65/400, 65/30.13, 30.14
See application file for complete search history.

(56) References Cited

U.S. PATENT DOCUMENTS

| 5,279,851 A * | 1/1994 | Minosou et al. ............ 427/126.2 |
| 2005/0153072 A1 * | 7/2005 | Otani et al. ................. 427/248.1 |

(Continued)

FOREIGN PATENT DOCUMENTS

| JP | 58-145642 | 8/1983 |
| JP | 62-191449 | 8/1987 |

(Continued)

OTHER PUBLICATIONS

U.S. Appl. No. 14/309,073, filed Jun. 19, 2014, Okahata, et al.

(Continued)

*Primary Examiner* — David Sample
*Assistant Examiner* — Lauren Colgan
(74) *Attorney, Agent, or Firm* — Oblon, McClelland, Maier & Neustadt, L.L.P.

(57) ABSTRACT

A method includes: forming at least one layer of a film formed of an inorganic material, that contains H atoms in a concentration of $1.0 \times 10^{15}$ to $1.0 \times 10^{19}$ atom/mm³, on at least a top surface of a glass substrate having a bottom surface to contact a molten metal during forming and the top surface facing the bottom surface, thereby reducing a warpage of the glass substrate caused by a chemical strengthening process performed after forming the at least one layer on the top surface of the glass substrate. The glass substrate is formed by a float process.

8 Claims, 2 Drawing Sheets

(51) Int. Cl.
*B32B 17/06* (2006.01)
*C03C 17/245* (2006.01)

(56) References Cited

U.S. PATENT DOCUMENTS

| | | | |
|---|---|---|---|
| 2006/0115651 A1* | 6/2006 | Merfeld et al. | 428/410 |
| 2011/0062436 A1* | 3/2011 | Yamazaki et al. | 257/43 |
| 2011/0068335 A1* | 3/2011 | Yamazaki et al. | 257/43 |
| 2011/0293928 A1* | 12/2011 | Chu et al. | 428/336 |
| 2012/0196110 A1* | 8/2012 | Murata et al. | 428/220 |
| 2012/0198888 A1* | 8/2012 | Hasegawa et al. | 65/17.2 |
| 2014/0102144 A1* | 4/2014 | Yamanaka et al. | 65/30.14 |
| 2014/0127474 A1* | 5/2014 | Chu et al. | 428/174 |
| 2014/0302330 A1* | 10/2014 | Okahata et al. | 428/432 |
| 2014/0305165 A1* | 10/2014 | Okahata et al. | 65/30.14 |

FOREIGN PATENT DOCUMENTS

| | | |
|---|---|---|
| JP | 63-060129 | 3/1988 |
| JP | 4-310544 | 11/1992 |
| JP | 7-72093 | 8/1995 |
| JP | 2001-192239 | 7/2001 |
| WO | 2008/004481 | 1/2008 |
| WO | 2011/049030 | 4/2011 |

OTHER PUBLICATIONS

International Search Report issued Mar. 26, 2013 in PCT/JP2012/082297 filed Dec. 13, 2012.

* cited by examiner

METHOD FOR REDUCING WARPAGE OF GLASS SUBSTRATE CAUSED BY CHEMICAL STRENGTHENING PROCESS, AND METHOD FOR PRODUCING CHEMICALLY STRENGTHENED GLASS SUBSTRATE

TECHNICAL FIELD

The present invention relates to a method for reducing warpage of a glass substrate caused by a chemical strengthening process, and a method for producing a chemically strengthened glass substrate.

BACKGROUND ART

In recent years, in a flat panel display device such as a mobile phone or a personal digital assistant (PDA), or a flat pane, in order to enhance protection and beauty of a display, a thin sheet-shaped cover glass is arranged on a front surface of a display so as to cover a region wider than an image display area.

Weight reduction and thickness reduction are required for such a flat panel display device, and to achieve the requirement, a cover glass used for protecting a display is also required to reduce its thickness.

However, when the thickness of a cover glass is reduced, strength thereof is decreased, and the cover glass itself may break during use or by drop during carrying. Therefore, there is a problem that the primary role of protecting a display device cannot be performed.

For this reason, to improve scratch resistance, in the conventional cover glass, a float glass produced by a float process is chemically strengthened to form a compressive stress layer on the surface thereof, thereby enhancing scratch resistance of the cover glass.

In recent years, the higher scratch resistance is required for a cover glass and the like. The surface compressive stress of a chemically strengthened float glass obtained by chemically strengthening the conventional soda lime glass was about 500 MPa, and a depth of a compressive stress layer was approximately about 10 µm. To respond to the requirement of high scratch resistance, a chemically strengthened float glass having a surface compressive stress of 600 MPa or more and a depth of a compressive stress layer of 15 µm or more is developed.

It is reported that warpage occurs in a float glass after chemical strengthening, thereby deteriorating flatness (Patent Document 1). The warpage occurs by the difference of the degree of behavior of chemical strengthening between a glass surface that does not contact with molten tin during float forming (hereinafter referred to as a "top surface") and a glass surface that contacts with molten tin during float forming (hereinafter referred to as a "bottom surface").

The warpage of a float glass becomes large with increasing the degree of behavior of chemical strengthening. Therefore, in a chemically strengthened float glass having the surface compressive stress of 600 MPa or more and a depth of a compressive stress layer of 15 µm or more, which has been developed to respond to the requirement of high scratch resistance, the problem of warpage becomes more obvious as compared with the conventional chemically strengthened float glass having the surface compressive stress of about 500 MPa and a depth of a compressive stress layer of about 10 µm.

Conventionally, it has been considered that the reason that the degree of behavior of chemical strengthening differs between the top surface and the bottom surface in a float glass is due to that a molten metal invades the glass surface contacting the molten metal during float forming (Patent Document 1).

Patent Document 1 discloses that a sheet-shaped body produced by a float process and processed is chemically strengthened after dipping in or contacting Li ion, Na ion or a mixed inorganic salt thereof without surface polishing, thereby improving the warpage.

Furthermore, conventionally, to reduce the warpage of the float glass, a coping method of decreasing strengthening stress by chemical strengthening or removing a surface heterogeneous layer by subjecting a top surface and bottom surface of a float glass to grinding treatment or polishing treatment, and then chemically strengthening the float glass, has been carried out.

CITATION LIST

Patent Document

Patent Document 1: Japanese Patent No. 2033034

SUMMARY OF INVENTION

Technical Problem

However, the method described in Patent Document 1 is required to dip a float glass in a mixed inorganic salt before chemical strengthening, and therefore is complicated. Furthermore, there is a possibility in a method of decreasing strengthening stress that strength of a float glass after chemical strengthening becomes insufficient.

Furthermore, with regard to the method of subjecting a top surface and bottom surface of a float glass to grinding treatment or polishing treatment before chemical strengthening, it is preferred to omit such a grinding treatment or polishing treatment from the standpoint of improvement in productivity.

Therefore, the present invention has an object to provide a method which can effectively inhibit the warpage of the glass substrate caused by the chemical strengthening process in a short time and can omit or simplify a grinding treatment or polishing treatment before chemical strengthening.

Solution to Problem

The present inventors have found that at least one layer of a film formed of an inorganic material, that contains H atoms in a concentration of $1.0 \times 10^{15}$ to $1.0 \times 10^{19}$ atom/mm$^3$, is formed on at least a top surface of a glass substrate having a bottom surface to contact a molten metal during forming and the top surface facing the bottom surface, thereby reducing a warpage of the glass substrate caused by a chemical strengthening process performed after forming the at least one layer on the top surface of the glass substrate, and thus, the present invention has been completed.

That is, the present invention is as follows.

1. A method comprising:

forming at least one layer of a film formed of an inorganic material, that contains H atoms in a concentration of $1.0 \times 10^{15}$ to $1.0 \times 10^{19}$ atom/mm$^3$, on at least a top surface of a glass substrate having a bottom surface to contact a molten metal during forming and the top surface facing the bottom surface, thereby reducing a warpage of the glass substrate caused by a chemical strengthening process performed after forming the at least one layer on the top surface of the glass substrate, wherein the glass substrate is formed by a float process.

2. A method for producing a chemically strengthened glass substrate, the method comprising:

forming at least one layer of a film formed of an inorganic material, that contains H atoms in a concentration of $1.0 \times 10^{15}$ to $1.0 \times 10^{19}$ atom/mm$^3$, on at least a top surface of a glass substrate having a bottom surface to contact a molten metal during forming and the top surface facing the bottom surface; and subjecting the glass substrate in which the film has been formed to a chemical strengthening process, wherein the glass substrate is formed by a float process.

3. The method according to the above 1 or 2, wherein the film formed of the inorganic material is an alkali-free oxide.

4. The method according to the above 3, wherein the alkali-free oxide includes at least one of an oxide and a composite oxide, the oxide and composite oxide include at least one element selected from the group consisting of silicon, titanium, tin, aluminum, zinc, chromium, copper, manganese, iron, cobalt, nickel, zirconium, silver, niobium, molybdenum, antimony, and indium.

5. The method according to any one of the above 1 to 4, wherein the film formed of the inorganic material is a film formed by an atmospheric pressure CVD method.

Advantageous Effects of the Invention

In the glass substrate for chemical strengthening according to the present invention, a film formed of an inorganic material that contains H atoms is formed on at least one surface of the glass substrate, and the H atoms contained in the film alter the chemical structure in the film, thereby forming ion channels. Because of this, chemical strengthening process can be performed after the film has been formed on the glass substrate.

In the glass substrate for chemical strengthening according to the present invention, the extent of the warpage of the glass substrate after chemical strengthening can be reduced by adjusting the H atom content in the film formed of the inorganic material containing H atoms, the film formed on at least one surface of the glass substrate, without performing processes such as grinding and polishing before the chemical strengthening process.

In the glass substrate for chemical strengthening according to the present invention, the film formed of the inorganic material containing H atoms in a concentration of $1.0 \times 10^{15}$ to $1.0 \times 10^{19}$ atom/mm$^3$ can be formed on the glass substrate by using a film-formation method such as an atmospheric pressure CVD method or a sol-gel method.

In the case of the atmospheric pressure CVD, the film formed of the inorganic material containing H atoms in a concentration of $1.0 \times 10^{15}$ to $1.0 \times 10^{19}$ atom/mm$^3$ can be formed on a large-area glass substrate, and the glass substrate can be cut into the desired size after forming the film, i.e., before chemical strengthening, and thus, the productivity thereof is high.

The film-formation method such as the atmospheric pressure CVD method may be applied to a float line, and the film may be formed in the bath or in the subsequent annealing zone. In this way, the need to reheat the glass substrate can be eliminated, and an industrial process with small environmental load and high productivity can be provided.

From the standpoint of the sol-gel method, the coating liquid does not require the particles conventionally needed to provide a physical void space, and thus it can be provided at low cost. Further, because a technique of dispersing such particles in the coating liquid is not required, the coating liquid can be easily produced at low cost. This is advantageous in terms of both productivity and cost.

In the glass substrate for chemical strengthening according to the present invention, the functional film can be formed on a surface of the glass substrate that will be chemically strengthened glass, before chemically strengthening or shaping the glass substrate. It is therefore possible to produce a chemically strengthening or shaping the glass that has the functional film formed on the glass substrate surface with high productivity at low cost, by using the glass substrate for chemical strengthening according to the present invention.

DESCRIPTION OF EMBODIMENTS

Figure 1:
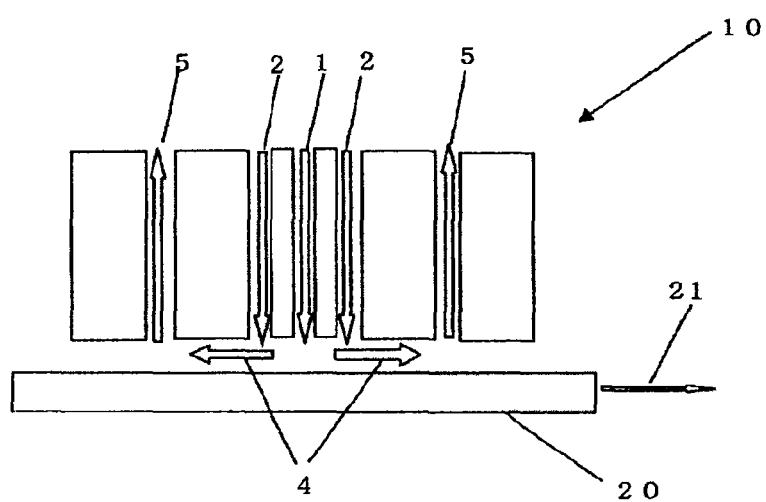
FIG. 1 is a schematic diagram of an apparatus used in Example.

The present invention is described below in detail.

<Glass Substrate>

As the glass substrate according to the present invention, a glass substrate having various compositions can be used, provided that the glass substrate is formed by the float process, and that the compositions are capable of being subjected to strengthening by a chemical strengthening process.

Specific examples thereof include colorless transparent soda-lime silicate glass, alumino silicate glass, borate glass, lithium alumino silicate glass, borosilicate glass, and alkali-free glass, and transparent glass plates formed of various other kinds of glass.

Among them, glass containing alkali metal ions or alkali earth metal ions, that have smaller ion radius, is preferred, and glass containing Na ions is more preferred. A glass substrate containing Na ions easily is capable of being subjected to ion replacement with metal ions having relatively small ion radius among metal ions having ion radius larger than Na, for example K ions. The Na ions can thus be more effectively replaced to thereby strengthen the glass, even when the glass substrate has a functional film formed on a surface thereof.

The thickness of the glass substrate is not particularly limited. Generally, the thickness of the glass substrate is preferably 5 mm or less, more preferably 3 mm or less for performing an effective chemical strengthening process which will be described later.

The composition of the glass substrate for chemical strengthening according to the present invention is not particularly limited. For example, the following glass compositions may be used.

(i) Glass composition containing, in mol %, 50 to 80% of SiO$_2$, 2 to 25% of Al$_2$O$_3$, 0 to 10% of Li$_2$O, 0 to 18% of Na$_2$O, 0 to 10% of K$_2$O, 0 to 15% of MgO, 0 to 5% of CaO, and 0 to 5% of ZrO$_2$.

(ii) Glass composition containing, in mol %, 50 to 74% of SiO$_2$, 1 to 10% of Al$_2$O$_3$, 6 to 14% of Na$_2$O, 3 to 11% of K$_2$O, 2 to 15% of MgO, 0 to 6% of CaO, and 0 to 5% of ZrO$_2$, in which the total content of SiO$_2$ and Al$_2$O$_3$ is 75% or less, the total content of Na$_2$O and K$_2$O is 12 to 25%, and the total content of MgO and CaO is 7 to 15%.

(iii) Glass composition containing, in mol %, 68 to 80% of SiO$_2$, 4 to 10% of Al$_2$O$_3$, 5 to 15% of Na$_2$O, 0 to 1% of K$_2$O, 4 to 15% of MgO, and 0 to 1% of ZrO$_2$.

(iv) Glass composition containing, in mol %, 67 to 75% of $SiO_2$, 0 to 4% of $Al_2O_3$, 7 to 15% of $Na_2O$, 1 to 9% of $K_2O$, 6 to 14% of MgO, and 0 to 1.5% of $ZrO_2$, in which the total content of $SiO_2$ and $Al_2O_3$ is 71 to 75%, the total content of $Na_2O$ and $K_2O$ is 12 to 20%, and when CaO is contained, the content thereof is less than 1%.

<Film Formed of Inorganic Material>

In the glass substrate for chemical strengthening according to the present invention, a film formed of an inorganic material containing H atoms in a concentration of $1.0 \times 10^{15}$ to $1.0 \times 10^{19}$ atom/mm$^3$ is formed on at least one surface of the glass substrate. The film formed of the inorganic material is typically an oxide film, a nitride film, a fluoride film, a metal film, or a laminated film of these.

Non-limiting examples of the oxides include alkali-free oxides such as $TiO_2$ and $SiO_2$, alkali element- or alkali earth element-containing composite oxides such as $LiMnO_4$ and $BaTiO_3$, and alkali oxides such as $K_2O$ and $Na_2O$.

Non-limiting examples of the nitrides include $Si_3N_4$, AlN, and BN.

Non-limiting examples of the fluoride film include $MgF_2$, $CaF_2$, $SrF_2$, and $BaF_2$.

Non-limiting examples of the metals include Ag and Cu.

The alkali-free oxide refers to oxides of elements other than alkali metal elements, specifically oxides and composite oxides, that contain one or more elements other than alkali metals, mixed oxides of two or more of the oxides and composite oxides, and laminates of the oxides and composite oxides.

The alkali-free oxide is preferably an oxide that includes at least one of oxides and composite oxides, wherein the oxides and composite oxides include at least one element selected from the group consisting of silicon, titanium, tin, aluminum, zinc, chromium, copper, manganese, iron, cobalt, nickel, zirconium, silver, niobium, molybdenum, antimony, and indium.

The film may be formed only of oxides, or may contain other compounds such as nitrides, fluorides, and sulfides, and may be combined with any element. Further, the film may be doped with small amounts of lanthanoid elements or actinoid elements.

Non-limiting examples of the alkali element-containing composite oxides include $LiMnO_4$ and $BaTiO_3$.

The content of the inorganic material in the film formed of the inorganic material is preferably 50 mass % or more, and more preferably 70 mass % or more. In the case where the content of the inorganic material in the film formed of the inorganic material is 50 mass % or more, the chemical strengthening can be evenly performed.

The film formed of the inorganic material containing H atoms in a concentration of $1.0 \times 10^{15}$ to $1.0 \times 10^{19}$ atom/mm$^3$ may be formed on only one of the surfaces of the glass substrate for chemical strengthening, or may be formed on the both surfaces. Generally, the film of the inorganic material covers preferably at least 50%, and more preferably at least 70% of the glass substrate surface.

Generally, the thickness of the film formed of the inorganic material film is preferably 5 to 600 nm, and more preferably 10 to 400 nm. In the case where the thickness thereof is 5 to 600 nm, the chemical strengthening can be evenly performed.

The H atom content in the inorganic material falls within a H atom concentration range of preferably $1.0 \times 10^{15}$ to $1.0 \times 10^{19}$ atom/mm$^3$, and more preferably 0.05 to 5 atom %. In the case where the H atom concentration in the inorganic material is $1.0 \times 10^{15}$ to $1.0 \times 10^{19}$ atom/mm$^3$, ions can be more easily replaced in chemical strengthening, and the dense film can be maintained. The H atom concentration in the inorganic material may be measured by secondary ion mass spectrometry.

In the glass substrate for chemical strengthening according to the present invention, the film formed of the inorganic material is formed on at least one surface of the glass substrate, and the H atoms contained in the inorganic material alter the chemical structure in the film, thereby forming ion channels. Because of this, the chemical strengthening process can be performed after the film has been formed on the glass substrate.

Furthermore, the present invention also can solve the problematic warpage of chemically strengthened float glass and resultant loss of flatness thereof. The warpage occurs when the degree of chemical strengthening on the glass surface (top surface) not in contact with the molten tin during forming by a float process is different from that on the glass surface (bottom surface) in contact with the molten metal (usually, tin).

Warpage of the chemically strengthened glass is believed to be due to the incorporation of the molten tin into the glass surface (bottom surface) in contact with the molten tin during glass forming by float process. Because the degree of chemical strengthening is small on the bottom surface as compared with the case on the top surface, the compressive stress due to the chemical strengthening is larger on the top surface, resulting in the warpage of glass so as to form convex toward the top surface side. This has been counteracted by reducing the strengthening stress, or by applying a chemical strengthening process after grinding and polishing the top surface.

In the glass substrate for chemical strengthening according to the present invention, the content of the H atoms in the inorganic material contained in the film formed on the glass substrate is adjusted to thereby adjust the diffusion rate of ions on the top surface and the bottom surface, so that the degree of chemical strengthening can be balanced between the top surface and the bottom surface. According to the glass substrate for chemical strengthening according to the present invention, the warpage of the glass substrate after a chemical strengthening process can be reduced without taking measures such as reducing the strengthening stress, or grinding and polishing the glass substrate before the chemical strengthening process.

For reducing the warpage of the glass substrate after the chemical strengthening process in the glass substrate for chemical strengthening according to the present invention, it is preferable to form the film formed of the inorganic material on the top surface or the bottom surface, whichever is higher degree of chemical strengthening, generally the top surface.

The film formed of the inorganic material may be formed on both of the top surface and the bottom surface. In this case, the warpage of the glass substrate after the chemical strengthening process can be reduced by adjusting the H atom contents in the inorganic material or thicknesses, in the film on the top surface side and in the film on the bottom surface side.

<Method for Forming Film Formed of Inorganic Material>

As the method for forming the film formed of the inorganic material, examples thereof include CVD (chemical vapor deposition) methods (such as an atmospheric pressure CVD method and a plasma CVD method), a sputtering method, a wet coating method, and a vapor deposition method. Among them, the CVD method is preferred, and the atmospheric pressure CVD method is more preferred, because these methods allow for easy deposition over a large area.

As a specific example thereof, the case of the formation of the film formed of the inorganic material on the glass substrate by a CVD method is described below with reference to the schematic diagram of FIG. 1.

With an injector 10 to be used for the atmospheric pressure CVD method, a gas containing an inorganic material source and an oxidizing agent is supplied to a glass substrate surface, and the inorganic material source and the oxidizing agent are reacted on the glass substrate surface, thereby obtaining a glass substrate having formed thereon a film formed of the inorganic material.

That is, a gas in which an inorganic material source in an amount of preferably 0.01 to 50 mass % at preferably 0.01 to 10 SLM and a carrier gas at preferably 1 to 1,000 SLM is mixed through a center slit 1 as shown in FIG. 1 is heated to preferably 10 to 200° C. An oxidizing agent at preferably 0.5 to 2,000 SLM, and a carrier gas at preferably 1 to 5,000 SLM are then blown thereon through outer slits 2 to thereby obtain a glass substrate having formed thereon preferably 5 to 600 nm of the inorganic material. The flow rate and temperature conditions are merely examples, and are not limited to these, as long as the inorganic material can be deposited in the desired amount. SLM stands for standard litter per minute The gas flows on/above a glass substrate 20 through a channel 4, and are discharged through discharge slits 5 preferably 1.0 to 20 times the amount of the total gas flow introduced into the injector. A hot-wire anemometer (for example, Climomaster 6543, manufactured by Kanomax) is used for measurements of gas temperature and flow rate.

The glass substrate is heated to preferably 300 to 700° C. The glass substrate temperature may be measured with an installed radiation thermometer, immediately before blowing the gas.

The inorganic material source is preferably an alkali-free source. The alkali-free source is preferably a silicon source, a titanium source, a tin source, or an indium source, but is not limited to these.

Non-limiting examples of the silicon source include $SiH_4$, $SiHCl_3$, $SiH_2Cl_2$, $SiH_3Cl$, $SiCl_4$, $Si(CH_3)_2Cl_2$, $SiBr_4$, $SiI_4$, $SiF_4$, and $Si(OC_2H_5)_4$.

Non-limiting examples of the titanium source include $Ti(OiPr)_4$, and $TiCl_4$. The term "(OiPr)" means iso-propoxy group.

Non-limiting examples of the tin source include $SnCl_4$, $n\text{-}C_4H_9SnCl_3$, tin acetate, $Sn(CH_3)_4$, and $(CH_3)_2SnCl_2$.

Non-limiting examples of the indium source include $InCl_3$, $InBr_3$, and $In(NO_3)_3$.

Non-limiting examples of the oxidizing agent include $O_2$, $O_3$, NO, $NO_2$, $N_2O$, CO, and $CO_2$.

The carrier gas is preferably a gas that does not react with the inorganic material source and the oxidizing agent at ordinary temperature. Examples thereof include $N_2$, air, $H_2$, $O_2$, Ne, Xe, $CO_2$, Ar, He, and Kr. These may be used either alone or in a combination of two or more. Among them, inert gas such as $N_2$ and Ar is preferable.

The film formed of the inorganic material may be a film having various functions. Non-limiting examples of such a functional film include a low reflective film, a heat-absorbing film, a heat-reflecting film, a UV absorbing film, a conductive film, and a glass burn prevention film. The same function(s) or different function(s) may be imparted to both of the surfaces of the glass substrate.

As a specific example of a method of imparting the same or different function(s) to both of the surfaces of the glass substrate, an inorganic material source and oxidizing agent, capable of imparting the same or different functional film(s) to each surface of both of the surfaces of the glass substrate are supplied in the annealing zone in the float process. In this way, a glass substrate having the same or different function(s) on both of the surfaces can be produced in a single process, without changing the glass composition. This method is very useful as a process with high productivity at low cost, because it enables the functional film(s) to be formed on the glass substrate in a single process, in addition to a common glass substrate producing method.

The glass substrate according to the present invention is formed by the float process, and can thus be generally transported with rollers. In the float process, the glass substrate is produced with a glass producing apparatus that includes a melting furnace that melts a glass raw material, a floating bath in which the molten glass is floated on molten metal (such as tin) to form a glass ribbon, and an annealing furnace that anneals the glass ribbon.

Thus, when the glass is formed on the molten metal (tin) bath, the inorganic material source and the oxidizing agent may be supplied to the glass substrate to be conveyed on the molten metal bath from the side not in contact with the metal surface, thereby forming the film formed of the inorganic material on the surface of the glass substrate.

The glass substrate is transported with rollers in the annealing zone located next to the molten metal (tin) bath. The annealing zone includes both the region of the annealing furnace and the region from the part in which the glass substrate is carried out of the molten metal (tin) bath in the floating bath to the part in which the conveyed glass substrate enters the annealing furnace. In the annealing zone, the inorganic material source and the oxidizing agent may be supplied from the top surface not in contact with the molten metal (tin), or from the bottom surface in contact with the molten metal (tin).

The glass substrate, the surface of which the film formed of the inorganic material has been formed, may be produced on line by using the glass producing technique based on the float process in combination with methods such as a CVD method, a spray method, a roll coating method and a flow coating method. In this case, the film formed of the inorganic material may be formed on the glass substrate by supplying a gas containing an inorganic material source and oxidizing agent from the surface not in contact with the molten metal (tin), or the surface (top surface) not in contact with the roller. The film formed of the inorganic material also may be formed on the glass substrate by appropriately supplying the liquid.

The float glass for chemical strengthening according to the present invention may have a multilayer structure in which a plurality of films having different properties is laminated on a glass substrate surface. As a specific method of forming such a multilayer structure in which a plurality of films having different properties is laminated on a glass substrate surface, for example, a $TiO_2$ film (first layer) is deposited on a glass substrate surface, a silica film (second layer) is deposited on the $TiO_2$ film, and a $SnO_2$ layer (third layer) is deposited on the silica film, thereby obtaining a multilayer transparent conductive oxide film.

<Chemical Strengthening Process>

The chemical strengthening process may be performed according to a conventional method. It is preferred that, before the chemical strengthening process, a shaping process according to the intended use, for example, such as cutting, end-surface machining, drilling, and other mechanical processes is performed. The cutting or the like may be performed after performing the chemical strengthening process.

In the chemical strengthening process, the glass substrate is contacted with a melt of metal salts (for example, potassium nitrate) containing metal ions having a large ion radius (typically, K ions) by immersing, and then, the metal ions having a small ion radius (typically, Na ions or Li ions) contained in the glass substrate is replaced with the metal ions having a large ion radius.

The chemical strengthening process may be performed, for example, by immersing the glass substrate in potassium nitrate solution at 300 to 550° C. for 5 minutes to 20 hours. As the conditions of the ion exchange, optimum condition may be selected by taking into consideration factors such as the viscosity characteristics of glass, use application, substrate thickness, and the tensile stress inside the glass.

Examples of the molten salts for performing the ion exchange process include potassium nitrate, and alkali sulfates and alkali chlorides, for example, such as sodium sulfate, potassium sulfate, sodium chloride, and potassium chloride. These molten salts may be used either alone or in combination.

The conditions of the chemical strengthening process are not particularly limited in the present invention, and optimum conditions may be selected by taking into consideration factors such as the glass properties and the molten salt.

By chemically strengthening the glass substrate for chemical strengthening according to the present invention, a chemically strengthened glass product that has the functional film on a surface of the chemically strengthened glass substrate can be obtained. Examples of such chemically strengthened glass products include cover glass of display devices such as digital cameras, cell phones, PDAs and touch panels, and glass substrate of the display. It can be applied to a glass substrate included in display devices or devices.

EXAMPLES

The present invention is described below in greater detail using Examples. The present invention, however, is not limited to these.

(1) Production of Float Glass

A glass material having the following composition was used to produce a float glass sheet having a thickness of 0.8 mm, by the float process. The float glass sheet was used after being cut into 50×50 mm.

(Glass Material A)

Glass containing, in mol %, 64.3% of $SiO_2$, 8.0% of $Al_2O_3$, 12.5% of $Na_2O$, 4.0% of $K_2O$, 10.5% of MgO, 0.1% of CaO, 0.1% of SrO, 0.1% of BaO, and 0.5% of $ZrO_2$.

(2) Preparation of Glass Substrate for Chemical Strengthening

A gas containing monosilane ($SiH_4$) and oxygen ($O_2$) was supplied to a surface of the float glass sheet produced in the above (1), by using the injector 10 used for atmospheric pressure CVD in the manner shown in the schematic diagram of FIG. 1. The monosilane and the oxygen were reacted on the glass substrate surface, thereby obtaining a glass substrate on which a $SiO_2$ film had been formed.

That is, a gas in which 30% $SiH_4$ at 0.09 SLM and nitrogen ($N_2$) at 40.4 SLM were mixed through the center slit 1 as shown in FIG. 1 was heated to 150° C., and oxygen at 4.1 SLM and nitrogen at 36.5 SLM were blown thereon through the outer slits 2 at a flow rate of 72 cm/s, thereby obtaining the glass substrate having formed thereon a 32-nm $SiO_2$ film.

The gas was flown through the channel 4 on/above the glass substrate 20, and was discharged 2 times the amount of the total gas flow introduced into the injector thorough the discharge slits 5. A hot-wire anemometer (Climomaster 6543, manufactured by Kanomax) was used for measurements of gas temperature and flow rate.

Alumino soda glass (thickness 0.8 mm; Tg: 617° C.) available from Asahi Glass Co., Ltd. was used as the glass substrate. The glass substrate was heated to 580° C., and transported at a rate of 2 m/min. The glass substrate temperature was measured with an installed radiation thermometer, immediately before the gas was blown.

(3) Measurement of H Atomic Weight in Film Formed of Inorganic Material in Glass Substrate for Chemical Strengthening The H atomic weight in the film formed of the inorganic material ($SiO_2$) formed on the surface of the glass substrate for chemical strengthening obtained in the above (2) was measured by secondary ion mass spectrometry (SIMS). The average H atom concentration (atom/cc) in the $SiO_2$ film was determined from the SIMS profile of the $SiO_2$ film, and this concentration was regarded as a H atomic weight. The analysis conditions are as follows.

Figure 2:
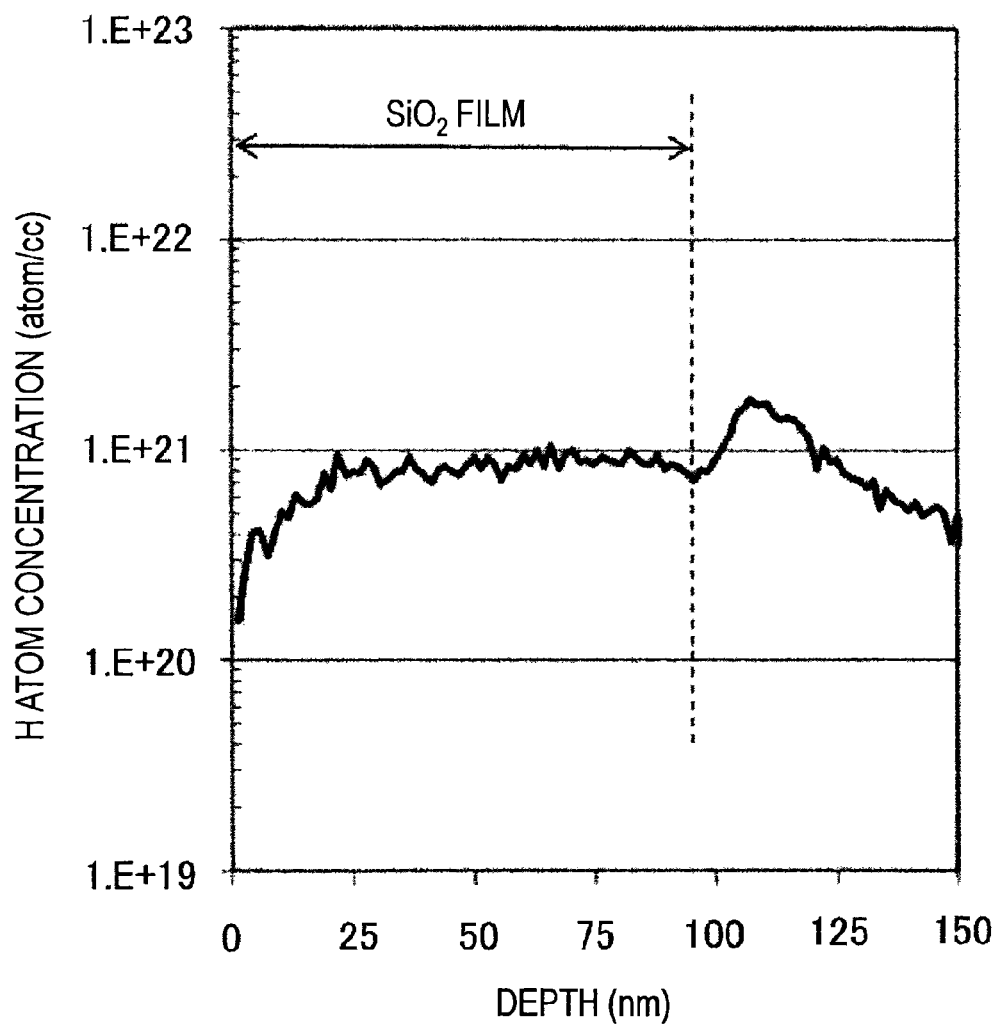
FIG. 2 represents the result of the measurement of average H atom concentration (atom/cc) in a SiO$_2$ film as determined from the SIMS profile of the SiO$_2$ film. For example, the notation 1E+23 means $1 \times 10^{+23}$.

Apparatus: ADEPT 1010, manufactured by Ulvac-Phi Incorporated
Primary ion species: $Cs^+$
Primary ion acceleration voltage: 1 kV
Primary ion current value: 100 nA
Primary Ion Luster Size: 300×300 μm$^2$
Incident angle: 60 degrees A $H^+$-doped fused quartz produced under the following conditions was used as a quantitative standard sample.
Ion species: $^1H^+$
Implantation energy: 3 kV
Implantation amount: $5.5×10^{+14}$ cm$^{-2}$ The result is shown in FIG. 2. The average H atom concentration in the film before the chemical strengthening was 7.9E+20 atom/cc, that is, $7.9×10^{+20}$ atom/cc (Example 1).

(4) Chemical Strengthening Process

The glass substrate for chemical strengthening obtained in the above (2) was subjected to a chemical strengthening process with a potassium nitrate molten salt at 435° C. for 4 hours.

(5) Measurement of Surface Stress and Depth of Compressive Stress Layer

The float glass after the chemically strengthening was measured for surface stress mean value (CS; unit, MPa), and the depth of the compressive stress layer (DOL; unit, μm). A surface stress meter (FSM-6000LE, manufactured by Orihara Manufacturing Co., Ltd.) was used for the measurements of the surface stress mean value (CS) and the depth of the compressive stress layer. The results are shown in Table 1.

TABLE 1

| | Thin-film forming method | Film composition | Film thickness (nm) | First surface: Film-formed surface | | Second surface: Non-film-formed surface | | Δ Warpage amount (μm) |
|---|---|---|---|---|---|---|---|---|
| | | | | CS (MPa) | DOL (μm) | CS (MPa) | DOL (μm) | |
| Ex. 1 | CVD | $SiO_2$ | 32 | 853 | 40.5 | 871 | 39.7 | 1.3 |
| Ex. 2 | CVD | $SiO_2$ | 42 | 853 | 40.1 | 885 | 40.1 | −26.3 |
| Ref. Ex. 1 | Ref | — | — | 875 | 42.2 | 866 | 40.7 | 23.2 |

As shown in Table 1, the stress values measured on the film-formed surfaces of the chemically strengthened glass substrates for chemical strengthening that had a 100-nm $SiO_2$ film (Examples 1 and 2) were compared with the case of the chemically strengthened glass substrate for chemical strengthening in which a film was not formed (Comparative Example 1), and then, it was found that the similar stress values were given.

It was found from these results that, the film formed of the inorganic material containing H atoms is formed on the glass substrate in the glass substrate for chemical strengthening according to the present invention, and thus, the chemical strengthening process can be performed after the film has been formed on the glass substrate.

It was also found that Δ warpage amount which is a difference in the warpage amount of the glass substrate before and after the chemical strengthening is reduced after the glass for chemical strengthening that contains H atoms in a content of $1.0 \times 10^{15}$ to $1.0 \times 10^{19}$ atom/mm³ in the inorganic material contained in the film formed on the glass substrate surface has been subjected to chemical strengthening, as shown in Table 1. In addition, Δ warpage amount is decreased as the depth of the compressive stress layer decreased.

In addition, as shown in Table 1, in Example 2 in which the film composed of $SiO_2$ was formed so as to be thick, Δ warpage amount was a negative value. From these results, it was found that the warpage amount of the glass substrate after chemical strengthening can be controlled by adjusting the thickness of the film formed of the inorganic material, the film being formed on the glass substrate.

It was found from these results that, by forming the film formed of the inorganic material containing H atoms on the glass substrate, the depth of the compressive stress layer is made smaller, and the warpage of the glass substrate after the chemical strengthening is reduced.

Although the present invention has been described in detail and by reference to the specific embodiments, it is apparent to one skilled in the art that various modifications or changes can be made without departing the spirit and scope of the present invention. This application is based on Japanese Patent Application No. 2011-283756 filed on Dec. 26, 2011, the content of which is incorporated herein by reference.

REFERENCE SIGNS LIST

1: Center slit
2: Outer slits
4: Channel
5: Discharge slits
10: Injector
20: Glass substrate

The invention claimed is:

1. A method comprising:
    forming at least one layer of a film formed of an inorganic material, that contains H atoms in a concentration of $1.0 \times 10^{15}$ to $1.0 \times 10^{19}$ atom/mm³, on at least a top surface of a glass substrate having a bottom surface to contact a molten metal during forming and the top surface facing the bottom surface, thereby reducing a warpage of the glass substrate caused by a chemical strengthening process performed after forming the at least one layer on the top surface of the glass substrate,
    wherein the glass substrate is formed by a float process.

2. The method according to claim 1, wherein the inorganic material is an alkali-free oxide.

3. The method according to claim 2, wherein the alkali-free oxide includes at least one of an oxide and a composite oxide, the oxide and composite oxide include at least one element selected from the group consisting of silicon, titanium, tin, aluminum, zinc, chromium, copper, manganese, iron, cobalt, nickel, zirconium, silver, niobium, molybdenum, antimony, and indium.

4. The method according to claim 1, wherein the film formed of the inorganic material is a film formed by an atmospheric pressure CVD method.

5. A method for producing a chemically strengthened glass substrate, the method comprising:
    forming at least one layer of a film formed of an inorganic material, that contains H atoms in a concentration of $1.0 \times 10^{15}$ to $1.0 \times 10^{19}$ atom/mm³, on at least a top surface of a glass substrate having a bottom surface to contact a molten metal during forming and the top surface facing the bottom surface; and
    subjecting the glass substrate in which the film has been formed to a chemical strengthening process,
    wherein the glass substrate is formed by a float process.

6. The method according to claim 5, wherein the inorganic material is an alkali-free oxide.

7. The method according to claim 6, wherein the alkali-free oxide includes at least one of an oxide and a composite oxide, the oxide and composite oxide include at least one element selected from the group consisting of silicon, titanium, tin, aluminum, zinc, chromium, copper, manganese, iron, cobalt, nickel, zirconium, silver, niobium, molybdenum, antimony, and indium.

8. The method according to claim 5, wherein the film formed of the inorganic material is a film formed by an atmospheric pressure CVD method.

* * * * *